United States Patent
Bader et al.

(10) Patent No.: US 7,319,247 B2
(45) Date of Patent: Jan. 15, 2008

(54) LIGHT EMITTING-DIODE CHIP AND A METHOD FOR PRODUCING SAME

(75) Inventors: Stefan Bader, Eilsbrunn (DE); Berthold Hahn, Heman (DE); Volker Härle, Laaber (DE); Hans-Jürgen Lugauer, Sinzing (DE); Manfred Mundbrod-Vangerow, Oxenbronn (DE)

(73) Assignee: Osram GmbH, Munich (DE)

( * ) Notice: Subject to any disclaimer, the term of this patent is extended or adjusted under 35 U.S.C. 154(b) by 0 days.

(21) Appl. No.: 10/258,340

(22) PCT Filed: Mar. 16, 2001

(86) PCT No.: PCT/DE01/01003

§ 371 (c)(1),
(2), (4) Date: Jun. 10, 2003

(87) PCT Pub. No.: WO01/84640

PCT Pub. Date: Nov. 8, 2001

(65) Prior Publication Data

US 2004/0026709 A1 Feb. 12, 2004

(30) Foreign Application Priority Data

Apr. 26, 2000 (DE) .................. 100 20 464
May 26, 2000 (DE) .................. 100 260255

(51) Int. Cl.
*H01L 33/00* (2006.01)
(52) U.S. Cl. .................. 257/103; 257/98; 257/13; 257/17; 257/94; 257/E33; 257/E33.034; 257/E33.072
(58) Field of Classification Search .............. 257/103, 257/13, 17, 94, 98, E33.001, E33.034, E33.072
See application file for complete search history.

(56) References Cited

U.S. PATENT DOCUMENTS 4,232,440 A 11/1980 Bastek (Continued)

FOREIGN PATENT DOCUMENTS

CN 1218997 6/1999

(Continued)

OTHER PUBLICATIONS

P.M. Mensz et al., "$In_xGa_{1-x}N/Al_yGa_{1-y}N$ violet light emitting diodes with reflective p-contacts for high single sided light extraction", *Electronics Letters*, vol. 33, No. 24, pp. 2066-2068 (Nov. 20, 1997).

(Continued)

*Primary Examiner*—Long K. Tran
(74) *Attorney, Agent, or Firm*—Fish & Richardson P.C.

(57) ABSTRACT

An LED chip comprising an electrically conductive and radioparent substrate, in which the epitaxial layer sequence (3) is provided on substantially the full area of its p-side (9) with a reflective, bondable p-contact layer (6). The substrate (2) is provided on its main surface (10) facing away from the epitaxial layer sequence (3) with a contact metallization (7) that covers only a portion of said main surface (10), and the decoupling of light from the chip (1) takes place via a bare region of the main surface (10) of the substrate (2) and via the chip sides (14). A further LED chip has epitaxial layers only. The p-type epitaxial layer (5) is provided on substantially the full area of the main surface (9) facing away from the n-conductive epitaxial layer (4) with a reflective, bondable p-contact layer (6), and the n-conductive epitaxial layer (4) is provided on its main surface facing away from the p-conductive epitaxial layer (5) with an n-contact layer (7) that covers only a portion of said main surface (8). The decoupling of light from the chip (1) takes place via the bare region of the main surface (8) of the n-conductive epitaxial layer (4) and via the chip sides (14).

14 Claims, 4 Drawing Sheets

U.S. PATENT DOCUMENTS

| | | | |
|---|---|---|---|
| 4,243,996 A | 1/1981 | Lebailly et al. | |
| 4,983,538 A | 1/1991 | Gotou | |
| 5,040,044 A | 8/1991 | Noguchi et al. | 357/52 |
| 5,157,468 A | 10/1992 | Matsumoto | |
| 5,210,051 A | 5/1993 | Carter, Jr. | |
| 5,362,667 A | 11/1994 | Linn et al. | |
| 5,373,184 A | 12/1994 | Moslehi | |
| 5,374,564 A | 12/1994 | Bruel | |
| 5,376,580 A | 12/1994 | Kish et al. | 437/127 |
| 5,429,954 A | 7/1995 | Gerner | |
| 5,625,202 A | 4/1997 | Chai | 257/94 |
| 5,661,074 A | 8/1997 | Tischler | |
| 5,701,321 A | 12/1997 | Hayafuji et al. | |
| 5,728,623 A | 3/1998 | Mori | |
| 5,739,554 A | 4/1998 | Edmond et al. | |
| 5,753,134 A | 5/1998 | Biebl | |
| 5,780,873 A | 7/1998 | Itaya et al. | |
| 5,786,606 A | 7/1998 | Nishio et al. | |
| 5,851,905 A | 12/1998 | McIntosh et al. | |
| 5,862,167 A | 1/1999 | Sassa et al. | |
| 5,866,468 A | 2/1999 | Kono et al. | |
| 5,874,747 A | 2/1999 | Redwing et al. | |
| 5,877,070 A | 3/1999 | Goesele et al. | |
| 5,880,491 A | 3/1999 | Soref et al. | |
| 5,917,202 A | 6/1999 | Haitz et al. | |
| 5,928,421 A | 7/1999 | Yuri et al. | 117/97 |
| 5,985,687 A | 11/1999 | Bowers et al. | |
| 6,046,464 A | 4/2000 | Schetzina | |
| 6,060,335 A | 5/2000 | Rennie et al. | 438/46 |
| 6,060,730 A | 5/2000 | Tsutsui | |
| 6,100,104 A | 8/2000 | Haerle | 438/33 |
| 6,111,272 A | 8/2000 | Heinen | |
| 6,133,589 A * | 10/2000 | Krames et al. | 257/103 |
| 6,150,230 A | 11/2000 | Kotecki et al. | |
| 6,222,207 B1 | 4/2001 | Carter-Coman et al. | |
| 6,258,618 B1 | 7/2001 | Lester | |
| 6,291,839 B1 | 9/2001 | Lester | |
| 6,303,405 B1 | 10/2001 | Yoshida et al. | |
| 6,328,796 B1 | 12/2001 | Kub et al. | |
| 6,335,212 B1 | 1/2002 | Uemura et al. | |
| 6,347,101 B1 | 2/2002 | Wu et al. | |
| 6,365,427 B1 | 4/2002 | Gauggel et al. | |
| 6,420,199 B1 | 7/2002 | Coman et al. | |
| 6,420,242 B1 | 7/2002 | Cheung et al. | |
| 6,448,102 B1 | 9/2002 | Kneissl et al. | |
| 6,468,824 B2 | 10/2002 | Chen et al. | |
| 6,495,862 B1 | 12/2002 | Okazaki et al. | |
| 6,518,079 B2 | 2/2003 | Imler | |
| 6,562,701 B2 | 5/2003 | Ishida et al. | |
| 6,607,931 B2 | 8/2003 | Streubel | |
| 6,617,182 B2 | 9/2003 | Ishida et al. | |
| 6,617,261 B2 | 9/2003 | Wong et al. | |
| 6,620,643 B1 | 9/2003 | Koike | |
| 6,677,173 B2 | 1/2004 | Ota | |
| 6,849,878 B2 | 2/2005 | Bader et al. | |
| 6,869,820 B2 | 3/2005 | Chen | |
| 6,878,563 B2 | 4/2005 | Bader et al. | |
| 6,924,163 B2 | 8/2005 | Okazaki et al. | |
| 6,946,312 B2 | 9/2005 | Kon et al. | |
| 6,975,444 B2 | 12/2005 | Huibers | |
| 2001/0042866 A1 | 11/2001 | Coman et al. | |
| 2002/0096102 A1 | 7/2002 | Sloot | |
| 2003/0086856 A1 | 5/2003 | D'Evelyn et al. | |
| 2003/0131788 A1 | 7/2003 | Ueda | |
| 2003/0168664 A1 | 9/2003 | Hahn et al. | |
| 2003/0197170 A1 | 10/2003 | Bader et al. | |
| 2004/0033638 A1 | 2/2004 | Bader et al. | |
| 2004/0222434 A1 | 11/2004 | Uemura et al. | |
| 2005/0282373 A1 | 12/2005 | Bader et al. | |
| 2006/0011925 A1 | 1/2006 | Bader et al. | |

FOREIGN PATENT DOCUMENTS

| | | |
|---|---|---|
| DE | 2915888 | 10/1979 |
| DE | 40 38216 | 7/1991 |
| DE | 43 05296 | 8/1994 |
| DE | 690 08931 | 12/1994 |
| DE | 19753492 | 9/1998 |
| DE | 19830838 | 1/1999 |
| DE | 19741442 | 4/1999 |
| DE | 19921987 | 11/1999 |
| DE | 19838810 | 3/2000 |
| DE | 10000088 | 8/2000 |
| EP | 0051172 | 5/1982 |
| EP | 0282075 | 9/1988 |
| EP | 0317445 | 5/1989 |
| EP | 0 356 037 | 2/1990 |
| EP | 0 404 565 | 12/1990 |
| EP | 07221347 | 8/1995 |
| EP | 080322116 | 2/1996 |
| EP | 08064910 | 3/1996 |
| EP | 08116090 | 5/1996 |
| EP | 0 740 376 | 10/1996 |
| EP | 0 810 674 | 12/1997 |
| EP | 0817283 | 1/1998 |
| EP | 10209494 | 8/1998 |
| EP | 0 871 228 | 10/1998 |
| EP | 0 896 405 | 2/1999 |
| EP | 0 905 797 | 3/1999 |
| EP | 11068157 | 3/1999 |
| EP | 11150297 | 6/1999 |
| EP | 11191641 | 7/1999 |
| GB | 2 322 737 | 9/1998 |
| GB | 2346478 | 8/2000 |
| JP | 10-42813 | 2/1989 |
| JP | 004223330 | 8/1992 |
| JP | 06-045651 | 2/1994 |
| JP | 08032116 | 2/1996 |
| JP | 8-307001 | 11/1996 |
| JP | 9-129927 | 5/1997 |
| JP | 09-223819 | 8/1997 |
| JP | 10150220 | 6/1998 |
| JP | 10-223496 | 8/1998 |
| JP | 63224213 | 9/1998 |
| JP | 10-290027 | 10/1998 |
| JP | 10-341036 | 12/1998 |
| JP | 11-074558 | 3/1999 |
| JP | 11074558 | 3/1999 |
| JP | 110744558 | 3/1999 |
| JP | 11-504764 | 4/1999 |
| JP | 11-145515 | 5/1999 |
| JP | 11-220168 | 8/1999 |
| JP | 11-220171 | 8/1999 |
| JP | 11-251634 | 9/1999 |
| JP | 11-284228 | 10/1999 |
| JP | 2000-77713 A | 3/2000 |
| JP | 200-101139 | 4/2000 |
| TW | 369731 | 9/1999 |
| TW | 441859 | 4/2000 |
| WO | WO92/13363 | 8/1992 |
| WO | 95/00974 | 1/1995 |
| WO | WO97/48138 | 12/1997 |
| WO | 00/19499 | 4/2000 |
| WO | WO 00/34989 | 6/2000 |
| WO | 01/41223 | 6/2001 |
| WO | 01/47038 | 6/2001 |
| WO | 01/47039 | 6/2001 |

OTHER PUBLICATIONS

Schnitzer, I. et al.:"30% external quantum efficiency from surface textured, thin-film light-emitting diodes", *Appl. Phys. Lett.*, vol. 63 (16), pp. 2174-2176; Oct. 1993.

Lee, J. L. et al., "Ohmic contact formation mechanism of nonalloyed Pd contacts to p-type GaN observed by positron annihilation spectroscopy", *Appl. Phys. Lett.*, 74(16), ISSN 0003-6951, 1999, S.2289-2291.

Margalith, T. et al., "Indium tin oxide contacts to gallium nitride optoelectronic devices", *Appl. Phys. Lett.*, 74(26), ISSN 0003-6951, 1999, S.3930-3932.

Steckl, A.J. et al, "Growth and Characterization of GaN Thin Films on SiC Sol Substrates", *Journal of Electronic Materials*, vol. 26, No. 3, 1997, pp. 217-223.

von Ardenne, M., "Tabellen zur angewandten Physik", *III. Band*, VEB Deutscher Verlag der Wissenschaften, Berlin, 1973, pp. 168-169.

Wong, W. S. et al., "Fabrication of thin-film InGaN light-emitting diode membranes by laser lift-off", *Appl. Phys. Letter*, vol. 75, No. 10, 1999, pp. 1360-1362.

* cited by examiner

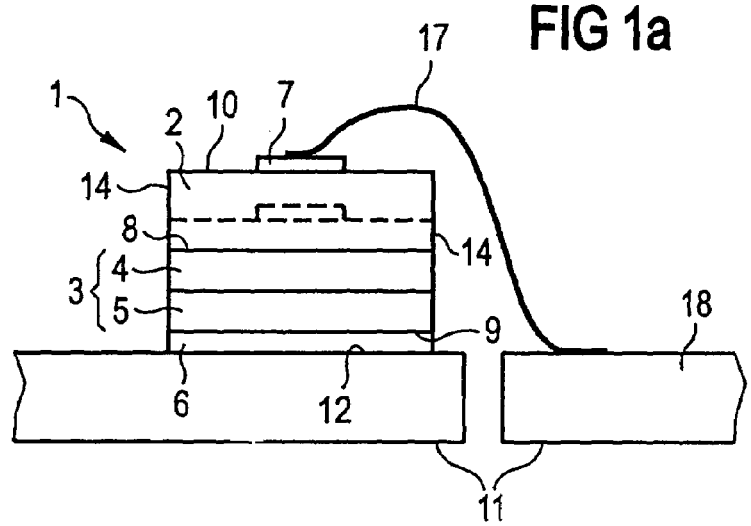
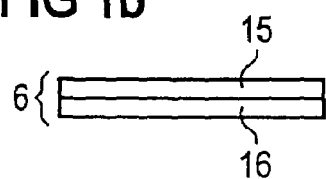
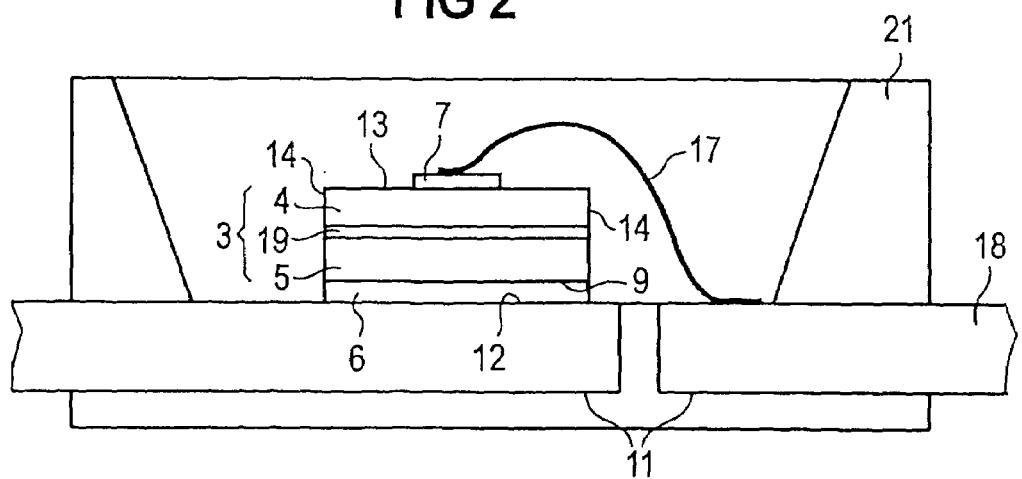

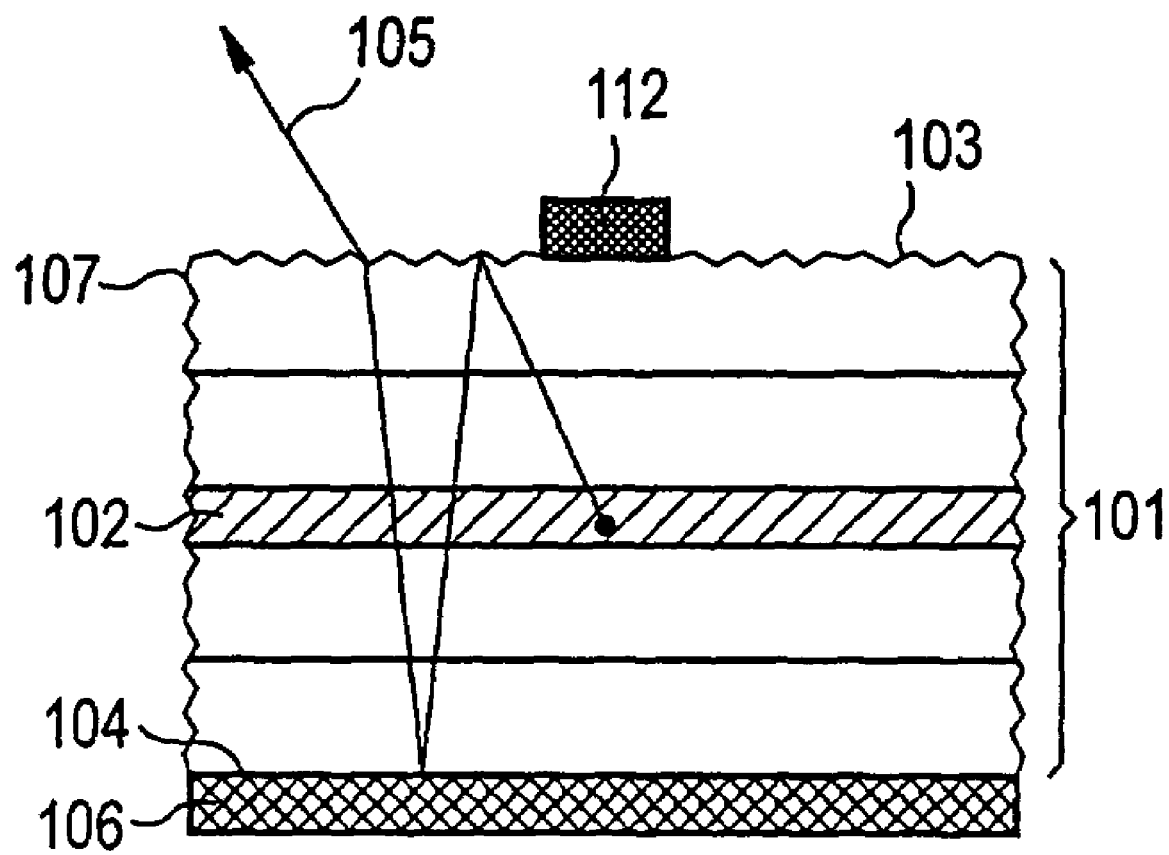

LIGHT EMITTING-DIODE CHIP AND A METHOD FOR PRODUCING SAME

CROSS REFERENCE TO RELATED APPLICATIONS

This application is the U.S. National Phase application of WIPO Application No. PCT/DE01/01003, filed on Mar. 16, 2001, which claims the benefit of foreign priority applications filed in Germany, Serial Nos. 10026255.4, filed on May 26, 2000, and 10020464.3, filed on Apr. 26, 2000.

FIELD OF THE INVENTION

The invention concerns a light-emitting diode and a method for fabricating the same.

BACKGROUND OF THE INVENTION

A fundamental problem in the fabrication of GaN-based light-emitting diode (LED) chips is that the maximum attainable electrical conductivity of p-doped layers, especially of p-doped GaN or AlGaN layers, is not sufficient, in conventional LED chips made of other material systems, to effect the spread of current over the entire lateral cross section of the chip, since the front contacts normally used in such chips are made to cover only a fraction of the front of the chip in order to bring about the highest possible decoupling of radiation.

Growing the p-type layer on an electrically conductive substrate, which would make it possible to impress a current over the entire lateral cross section of the p-type layer, does not furnish economically justifiable results. The reasons for this are that fabricating electrically conductive lattice-matched substrates (e.g. GaN substrates) for the growth of GaN-based layers involves high technical expenditure, and growing p-doped GaN-based layers on non-lattice-matched substrates suitable for undoped and n-doped GaN compounds does not yield adequate crystal quality for an LED.

A known approach for combating the above-cited problem is to cover the full area of the side of the p-type layer facing away from the substrate with a contact layer that is transparent to the radiation, or with an additional, readily conductive layer to effect current spread, provided with a bonding contact.

However, the first-cited proposal has the disadvantage that a substantial portion of the radiation is absorbed in the contact layer. The second-cited proposal requires an additional method step that increases production expenditure.

Japanese abstract JP 10-150 220A discloses a light-emitting semiconductor component in which an n-GaN semiconductor layer, a light-emitting layer and a p-GaN semiconductor layer are deposited sequentially on an n-GaN substrate. A p-electrode is arranged on the topside of the p-GaN semiconductor layer, covering it substantially completely.

BRIEF SUMMARY OF THE INVENTION

The object of the invention is, first, to develop an LED chip of the kind described at the beginning hereof that offers improved current spread and whose additional production expenditure is kept to a minimum. A method of fabricating an LED component comprising such a chip is also to be provided.

In an LED chip according to the invention, the substrate is electrically conductive. The n-type layers of the epitaxial layer sequence are deposited on the substrate first. Placed on these layers are the p-type layers of the epitaxial layer sequence, followed by a reflective, bondable p-contact layer that covers the surface fully from edge to edge. The substrate is provided, on its main surface facing away from the epitaxial layer sequence, with a contact metallization that covers only a portion of this main surface. The decoupling of light from the chip takes place via the bare region of the main surface of the substrate and via the chip sides.

The substrate advantageously serves here as a window layer that improves the decoupling of the radiation generated inside the chip. To optimize its thickness, the substrate is advantageously thinned, for example by grinding and/or etching, after the growth of the epitaxial layer sequence.

In a further LED chip according to the invention, the chip has epitaxial layers only. To this end, a growth substrate is removed after the epitaxial layer sequence has been grown epitaxially. The p-type epitaxial layer is provided, on substantially the full area of its main surface facing away from the n-type epitaxial layer, with a reflective, bondable p-contact layer. Disposed on the main surface of the n-type epitaxial layer facing away from the p-type epitaxial layer is an n-contact layer that covers only a portion of this main layer. The decoupling of light from the chip takes place via the bare region of the main surface of the n-type epitaxial layer and via the chip sides.

The growth substrate can in this case be both electrically insulating and radiopaque, and therefore advantageously can be chosen solely with a view toward ideal growth conditions.

The particular advantage of such a so-called thin-film LED chip lies in the reduced, ideally nonexistent, absorption of radiation in the chip and the improved decoupling of radiation from the chip, especially due to the smaller number of interfaces with jumps in the refractive index.

Both of the LED chips according to the invention have the particular advantage that the lost-heat-producing region (especially the p-doped layer and the p-n junction) of the chip can be situated very close to a heat sink; the epitaxial layer sequence can be thermally coupled to a heat sink practically directly. This enables the chip to be cooled very effectively, thereby increasing the stability of the emitted radiation. The efficiency of the chip is also increased.

In both of the LED chips according to the invention, the forward voltage is advantageously reduced due to the full-area contacting.

In the LED chip of the invention, the p-contact layer comprises, deposited on the p-side, a transparent first layer, and deposited thereon, a second, reflective layer. The contact layer can thus be optimized in a simple manner with regard to both its electrical and its reflective properties.

Preferred materials for the first layer are Pt and/or Pd, and for the second layer, Ag, Au and/or Al. The reflective layer can also, however, be realized as a dielectric mirror.

In another preferred improvement, the p-contact layer contains a PtAg and/or PdAg alloy.

In a further preferred embodiment, the entire bare surface of, or a subarea of, the semiconductor body formed by the layer sequence is roughened. This roughening disrupts the total reflection at the decoupling surface, thereby advantageously further increasing the degree of optical decoupling.

In a method according to the invention for fabricating an LED component comprising an LED chip according to the invention, the chip is mounted with the p-side on a chip mounting surface of an electrical connector, particularly a leadframe.

In an especially preferred improvement of the invention, the fabrication method is extended to include a roughening of the semiconductor body formed by the layer sequence, the entire bare surface of the semiconductor body, or subareas thereof, being roughened. A roughening that is particularly effective in increasing luminous efficiency is produced by etching the semiconductor body or by means of a sandblasting process.

BRIEF DESCRIPTION OF THE DRAWINGS

Further advantageous embodiments of the invention will emerge from the exemplary embodiments described hereinbelow in connection with FIGS. 1a to 5, wherein:

FIG. 1a is a schematic diagram of a section through a first exemplary embodiment;

FIG. 1b is a schematic diagram of a preferred p-contact layer;

FIG. 2 is a schematic diagram of a section through a second exemplary embodiment;

FIGS. 3a to 3c are a schematic diagram of a method sequence for fabricating the exemplary embodiment of FIG. 1a;

FIG. 5 is a schematic sectional view of an LED chip according to the invention.

In the figures depicting the various exemplary embodiments, like or like-acting components have been provided with the same or similar reference numerals.

DETAILED DESCRIPTION OF THE INVENTION

Figure 3A:
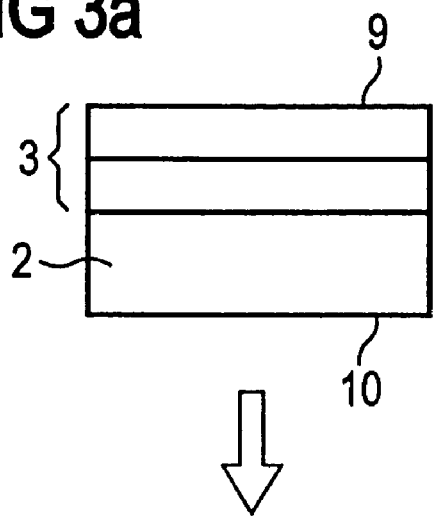

In the LED chip 1 of FIG. 1a, deposited on an SiC substrate 2 is a radiation-emitting epitaxial layer sequence 3 on an n-type side 8 of the substrate 2. This comprises, for example, an n-type doped GaN or AlGaN epitaxial layer 4 and a p-type doped GaN or AlGaN epitaxial layer 5. There can also be provided, for example, a GaN-based epitaxial layer sequence 3 having a double heterostructure, a single quantum well (SQW) structure or a multi-quantum well (MQW) structure comprising one or more undoped layers 19, for example of InGaN or InGaAlN.

The SiC substrate 2 is electrically conductive and is opaque to the radiation emitted by epitaxial layer sequence 3.

The p-side 9 of epitaxial layer sequence 3 facing away from the SiC substrate 2 comprises, deposited over substantially its full area, a reflective, bondable p-contact layer 6. This is composed, for example, substantially of Ag, a PtAg alloy and/or a PdAg alloy.

However, as illustrated schematically in FIG. 1b, p-contact layer 6 can also be composed of a transparent first layer 15 and a reflective second layer 16. First layer 15 is composed, for example, substantially of Pt and/or Pd, and second layer 16, for example, substantially of Ag, Au and/or Al or a dielectric mirror layer.

On its main surface 10 facing away from epitaxial layer sequence 3, SiC substrate 2 is provided with a contact metallization 7 that covers only a portion of said main surface 10 and is realized as a bond pad for wire bonding.

The contact metallization 7 is composed, for example, of a Ni layer deposited on SiC substrate 2, followed by an Au layer.

The chip 1 is mounted by die bonding, by its p-side, i.e., by p-contact layer 6, on a chip mounting surface 12 of a leadframe 11. The n-contact metallization 7 is connected via a bonding wire 17 to a connector 18 of leadframe 11.

The decoupling of light from chip 1 takes place via the bare region of main surface 10 of SiC substrate 2 and via the chip sides 14.

Optionally, chip 1 comprises a SiC substrate 2 that has been thinned after the growth of epitaxial layer sequence 3 (as indicated by the dotted lines in FIG. 1a).

The exemplary embodiment shown in FIG. 2 differs from that of FIG. 1a, for one thing, in that the chip 1 comprises only epitaxial layers and no substrate layer in epitaxial layer sequence 3. The substrate layer is removed, for example by etching and/or grinding, after the growth of the epitaxial layers. The advantages of such a so-called thin-film LED chip are set forth in the general part of the description. Another difference is that the epitaxial layer sequence 3 has a double heterostructure, a single quantum well (SQW) structure or a multi-quantum well (MQW) structure comprising one or more undoped layers 19, for example of InGaN or InGaAlN. An LED package 21 is also shown schematically here by way of example.

Figure 3B:
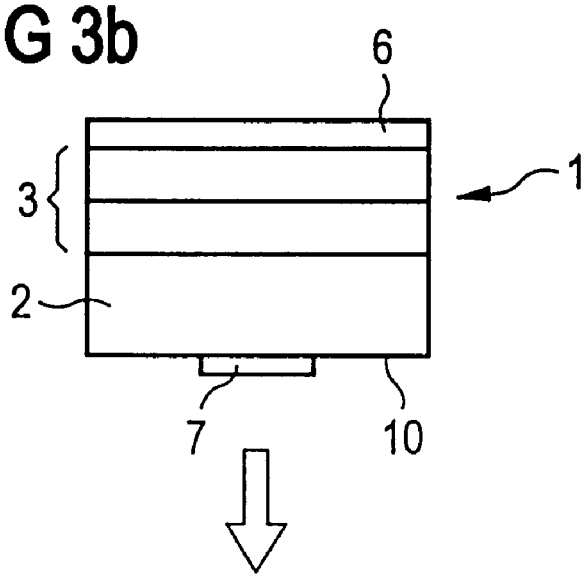
Figure 3C:
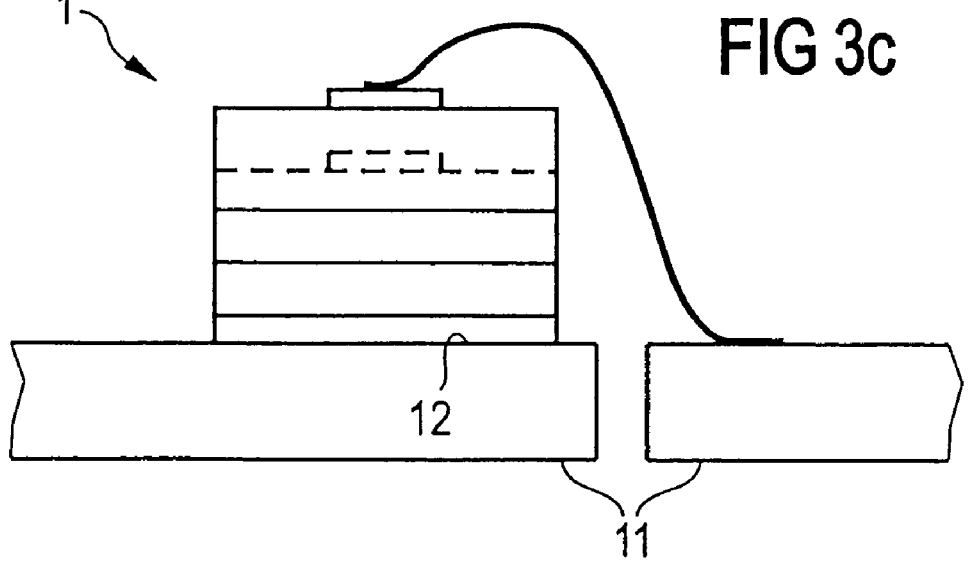

In the method sequence illustrated schematically in FIGS. 3a to 3c for fabricating an LED component comprising an LED chip 1 according to FIG. 1a, first, the radiation-emitting epitaxial layer sequence 3 is grown on the SiC substrate 2 (FIG. 3a). Next, the bondable p-contact layer 6 is deposited over the full area of the p-side 9 of epitaxial layer sequence 3, and the n-contact layer 7 is deposited on a subarea of the main surface 10 of substrate 2 facing away from epitaxial layer sequence 3 (FIG. 3b). These process steps all take place in the so-called wafer package, making it possible to fabricate a large number of chips side by side simultaneously.

According to the above-described process steps, the wafer composite is separated into individual chips 1. Each individual chip is then mounted on a chip mounting surface 12 of a leadframe 11 by being soldered to the respective bondable p-contact layer 6 (FIG. 3c).

Figure 4A:
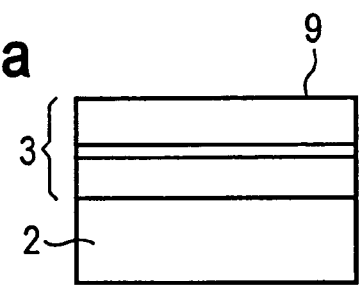
FIGS. 4a to 4e are a schematic diagram of a method sequence for fabricating the exemplary embodiment of FIG. 2.
Figure 4B:
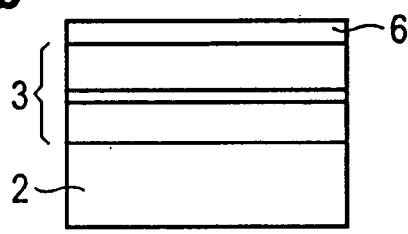
Figure 4C:
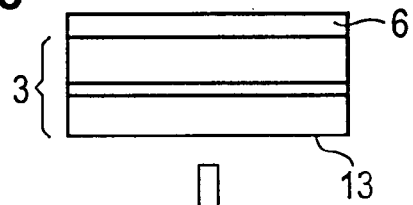
Figure 4D:
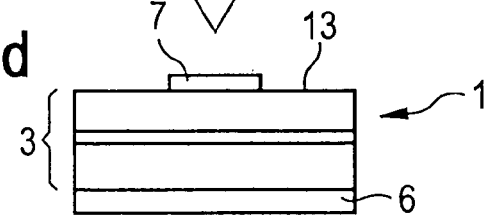
Figure 4E:
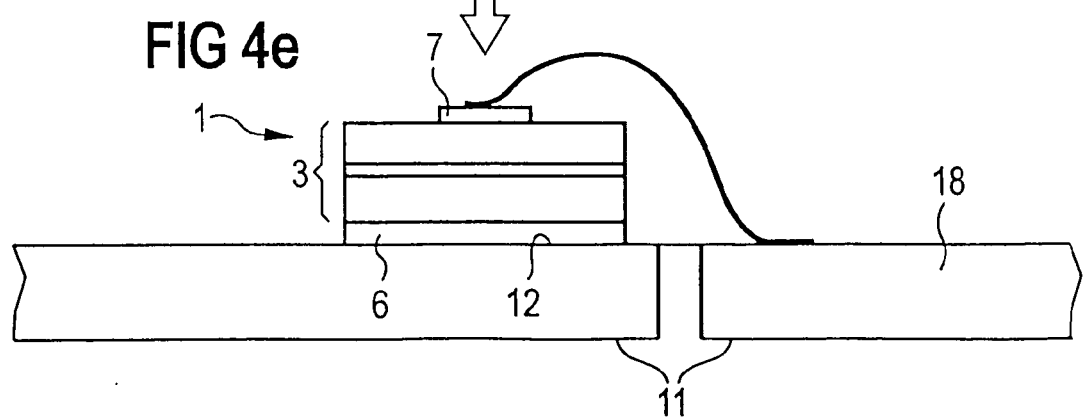

The method depicted schematically in FIGS. 4a to 4e for fabricating an LED component comprising an LED chip 1 according to FIG. 2 differs from that of FIGS. 3a to 3c essentially in that after the growth of epitaxial layer sequence 3 and before or after the deposition of p-contact layer 6, the substrate 2 is removed (FIG. 4c). The substrate 2 can in this case be both electrically insulating and radiopaque and thus can advantageously be designed solely with a view toward ideal growth conditions.

After the removal of substrate 2, the n-contact metallization 7 is deposited on the n-side 13 of epitaxial layer sequence 3 (FIG. 4d), after which the mounting steps are carried out (FIG. 4e) in an analogous manner to those described hereinabove in connection with FIG. 3c.

The exemplary embodiment shown in FIG. 5 comprises a plurality of semiconductor layers 101 arranged in a stacked shape and composed of GaN or a ternary or quaternary compound based on GaN. During operation, an active region 102 in which the radiation 105 is generated forms inside these layers.

The layer stack is bounded by a first main surface 103 and a second main surface 104. The generated radiation 105 is decoupled into the adjacent environment substantially by first main surface 103.

Deposited on second main surface 104 is a reflective, bondable p-contact layer 106 as described hereinabove. The semiconductor body is contacted on the decoupling side via contact surface 112 and on the reflector side via p-contact layer 106. The reflector-side contacting can be effected, for example, by placing the semiconductor, by its reflector side, on a metal body that serves both as a support and as a current feed.

The reflector 106 causes a portion of the radiation 105 that is reflected back into the semiconductor body on being decoupled at first main surface 103 to be re-reflected back toward first main surface 103, thus increasing the overall quantity of radiation decoupled by first main surface 103. This increase is made possible by the fact that the component is realized as a thin-film component without a radiation-absorbing substrate and the reflector 106 is deposited directly on the GaN semiconductor body.

The surface of the semiconductor body comprises a roughening 107. This roughening 107 causes a scattering of the radiation 105 at first main surface 103, thereby disrupting the total reflection from first main surface 103. Furthermore, this scattering keeps the generated radiation from being directed by successive similar reflections between the two main surfaces 103 and 104 and the reflector 106 in the manner of a waveguide without leaving the semiconductor body. Hence, the luminous efficiency is further increased by the roughening 107.

Naturally, the description of the invention with reference to the above exemplary embodiments is not to be construed as a restriction of the invention thereto. Instead, the invention can be used in particular in connection with all LED chips in which an epitaxial layer at a distance from a growth substrate possesses insufficient electrical conductivity.

The invention claimed is:

1. A light-emitting diode chip, comprising:
    an electrically conductive substrate having a first substrate surface, a second substrate surface opposite the first substrate surface, and at least one side surface;
    a GaN-based radiation-emitting epitaxial layer sequence comprising an n-type epitaxial layer deposited on the first substrate surface and a p-type epitaxial layer deposited on the n-type epitaxial layer;
    a reflective, bondable p-contact layer comprising a first layer transmissive of radiation emitted by the epitaxial sequence and disposed on a side of the epitaxial layer sequence opposite the substrate and a second layer reflective of radiation emitted by the epitaxial sequence and disposed on the first layer; and
    a contact metallization disposed over only a portion of the second substrate surface,
    wherein radiation emitted by the epitaxial layer is decoupled through a portion of the second substrate surface over which the metallization is not disposed and through the substrate side surface.

2. The light-emitting diode chip as recited in claim 1, wherein the electrically conductive substrate is thinned after the deposition of the epitaxial layer sequence.

3. The light-emitting diode chip as recited in claim 2, wherein the electrically conductive substrate is a silicon carbide substrate.

4. The light-emitting diode chip as recited in claim 2, wherein the first layer of the reflective, bondable p-contact layer comprises Pt and/or Pd and the second layer of the reflective, bondable p-contact layer comprises Ag, Au and/or Al.

5. The light-emitting diode chip as recited in claim 1, wherein the electrically conductive substrate is a silicon carbide substrate.

6. The light-emitting diode chip as recited in claim 1, wherein the first layer of the reflective, bondable p-contact layer comprises Pt and/or Pd and the second layer of the reflective, bondable p-contact layer comprises Ag, Au and/or Al.

7. The light-emitting diode chip as recited in claim 1, wherein the entire bare surface of, or a subarea of, the layer sequence is roughened.

8. A light-emitting diode chip as claimed in claim 1, wherein the reflective, bondable p-contact layer is provided on substantially the full area of the p-side of the epitaxial layer sequence.

9. The light-emitting diode chip as recited in claim 1, wherein the first layer of the reflective, bondable p-contact layer comprises Pt and/or Pd and the second layer of the reflective, bondable p-contact layer is realized as a dielectric mirror.

10. A light-emitting diode chip comprising:
    a GaN-based radiation-emitting epitaxial layer sequence comprising a n-type epitaxial layer and a p-type epitaxial layer;
    a reflecting, bondable p-contact layer disposed on a surface of the p-type epitaxial layer that is oriented away from the n-type epitaxial layer, the p-contact layer comprising a transparent first layer and, deposited thereon, a reflective second layer;
    an n-contact layer disposed over only a portion of a surface of the n-type epitaxial layer that is oriented away from the p-type epitaxial layer;
    wherein radiation emitted by the epitaxial layer is decoupled through a portion of the surface of the n-type epitaxial layer over which the n-contact layer is not disposed and through a side of the epitaxial layer sequence and wherein the chip does not include a growth substrate.

11. The light-emitting diode chip as recited in claim 10, the p-contact layer comprises a PtAg alloy and/or a PdAg alloy.

12. The light-emitting diode chip as recited in claim 10, wherein the first layer of the reflective, bondable p-contact layer comprises Pt and/or Pd and the second layer of the reflective, bondable p-contact layer comprises Ag, Au and/or Al.

13. A light-emitting diode chip as claimed in claim 10, wherein the reflective, bondable p-contact layer is provided on substantially the full area of the p-side of the epitaxial layer sequence.

14. The light-emitting diode chip as recited in claim 10, wherein the first layer of the reflective, bondable p-contact layer comprises Pt and/or Pd and the second layer of the reflective, bondable p-contact layer is realized as a dielectric mirror.

* * * * *

UNITED STATES PATENT AND TRADEMARK OFFICE
CERTIFICATE OF CORRECTION

PATENT NO. : 7,319,247 B2 Page 1 of 1
APPLICATION NO. : 10/258340
DATED : January 15, 2008
INVENTOR(S) : Stefan Bader et al.

It is certified that error appears in the above-identified patent and that said Letters Patent is hereby corrected as shown below:

On the title page, item [30]:
Foreign Application Priority Data, please replace "(DE) ... 100 260255" with --(DE) ... 100 26 255--

On the title page, page 2, item [56]:
Foreign Patent Documents, please replace:
  "EP 07221347 8/1995" with --JP 07-221347 .. 8/1995--
  "EP 08064910 3/1996" with --JP 08-064910 3/1996--
  "EP 08116090 5/1996" with --JP 08-116090 5/1996--
  "EP 10209494 8/1998" with --JP 10-209494 8/1998--
  "EP 11068157 3/1999" with --JP 11-068157 3/1999--
  "EP 11150297 6/1999" with --JP 11-150297 6/1999--
  "EP 11191641 7/1999" with --JP 11-191641 7/1999--
  "JP 004223330 8/1992" with --JP 04-2230330 8/1992--
  "JP 200-101139 4/2000" with --JP 2000-101139 4/2000--

Foreign Patent Documents, delete "EP 080322116 2/1996"
Foreign Patent Documents, delete "JP 11074558 3/1999"
Foreign Patent Documents, delete "JP 110744558 3/1999"

Signed and Sealed this

Fifth Day of January, 2010

David J. Kappos
*Director of the United States Patent and Trademark Office*